(12) United States Patent
Lym et al.

(10) Patent No.: US 8,717,830 B2
(45) Date of Patent: May 6, 2014

(54) NONVOLATILE SEMICONDUCTOR DEVICE AND METHOD FOR TESTING THE SAME

(75) Inventors: Sang Kug Lym, Icheon-si (KR); Yoon Jae Shin, Icheon-si (KR)

(73) Assignee: SK Hynix Inc., Icheon (KR)

( * ) Notice: Subject to any disclaimer, the term of this patent is extended or adjusted under 35 U.S.C. 154(b) by 23 days.

(21) Appl. No.: 13/550,842

(22) Filed: Jul. 17, 2012

(65) Prior Publication Data
US 2013/0294175 A1    Nov. 7, 2013

(30) Foreign Application Priority Data

May 4, 2012    (KR) .................... 10-2012-0047419

(51) Int. Cl.
*G11C 7/00*    (2006.01)
(52) U.S. Cl.
USPC .................... 365/189.05; 365/200

(58) Field of Classification Search
USPC .................... 365/189.05, 200, 201
See application file for complete search history.

(56) References Cited

U.S. PATENT DOCUMENTS 7,948,795 B2 *  5/2011  Hidaka .................... 365/173

* cited by examiner

*Primary Examiner* — Michael Tran

(57) ABSTRACT

A nonvolatile semiconductor device and a method for testing the same are provided. The nonvolatile semiconductor device includes a current generating unit configured to generate a set write current depending on a step pulse that is generated based on a reference current and output the set write current to a memory cell, and a current measuring unit configured to measure a step duration of the step pulse and output a measured result outside of a chip during an activation period of a test enable signal.

18 Claims, 10 Drawing Sheets

NONVOLATILE SEMICONDUCTOR DEVICE AND METHOD FOR TESTING THE SAME

CROSS-REFERENCE TO RELATED APPLICATION

The priority of Korean patent application No. 10-2012-0047419 filed on May 4, 2012 the disclosure of which is hereby incorporated in its entirety by reference, is claimed.

BACKGROUND OF THE INVENTION

The present invention relates to a nonvolatile semiconductor device and a method for testing the same, and more specifically, to a technology for controlling a write operation of a nonvolatile memory device configured to sense data based on resistance change.

Generally, memory devices may be classified as volatile memory devices or nonvolatile memory devices. A nonvolatile memory is device includes a nonvolatile memory cell capable of preserving stored data even when a power source is off. A nonvolatile memory device may be implemented, for example, as a flash random access memory (RAM) device, a phase change RAM (PCRAM) device, or the like.

PCRAM devices include memory cells that are implemented using a phase change material, for example, germanium antimony tellurium (GST), and are configured to store data in the memory cells by applying heat to the GST so that the GST changes into a crystalline phase or an amorphous phase.

A nonvolatile memory device, such as a magnetic memory device, a phase change memory (PCM) device, or the like, has a data processing speed similar to that of a volatile RAM device. A nonvolatile memory device also preserves data even when a power source is off.

FIGS. 1a and 1b illustrates a conventional phase change resistance device 4.

Referring to FIGS. 1a and 1b, a conventional phase change resistance device 4 includes an upper electrode 1, a lower electrode 3, and a phase change material 2 interposed between the upper electrode 1 and the lower electrode 3. When a voltage is applied to the upper electrode 1 and the lower electrode 3, a current flows into the phase change material 2, thus inducing a high temperature in the phase change material 2. As a result, the electrical conductive state of the phase change material 2 changes depending on resistance variation due to the high temperature.

FIGS. 2a and 2b illustrates a phase change principle of the conventional phase change resistance device 4.

Referring to FIG. 2a, if a low current smaller than a critical value flows into the phase change resistance device 4, the phase change material 2 is crystallized. When the phase change material 2 changes into a crystalline phase, it becomes a low resistance material. As a result, a current can flow between the upper electrode 1 and the lower electrode 3.

On the other hand, referring to FIG. 2b, if a high current greater than the critical value flows into the phase change resistance device 4, the phase change material 2 has a temperature higher than a quenching point. When the phase change material 2 changes into an amorphous phase, i.e., a non-crystalline phase, it becomes a high resistance material. As a result, a current cannot easily flow between the upper electrode 1 and the lower electrode 3.

The phase change resistance device 4 can store data corresponding to two resistance phases. That is, in one case, if a low resistance phase in the phase change resistance device corresponds to a data "1," and the high resistance phase corresponds to a data "0," then the phase change resistance device 4 may store two logic states of data.

This data can be stored in the phase change resistance device 4 as nonvolatile data because the status of the phase change material 2 does not change even when a power source is off.

FIG. 3 illustrates a write operation of a conventional phase change resistance cell.

Referring to FIG. 3, heat is generated if a current flows between the upper electrode 1 and the lower electrode 3 of the phase change resistance device 4 for a given time.

If a low current, smaller than the critical value, flows for the given time, the phase change material 2 changes into a crystalline phase. As a result, the phase change resistance device 4 becomes a low resistance element having a set phase.

On the other hand, if a high current, greater than the critical value, flows for a given time, the phase change material 2 changes into an amorphous phase. As a result, the phase change resistance device 4 becomes a high resistance element having a reset phase.

Accordingly, a low voltage is applied to the phase change resistance device 4 for a long period of time in order to write the set phase in the write operation.

On the other hand, a high voltage is applied to the phase change resistance device 4 for a short period of time in order to write the reset phase in the write operation.

To change the phase change resistance cell into the set phase, it is important to control a quenching slope of a set write current, which is required for crystalizing the phase change resistance cell, by gradually reducing an amount of the set write current. This way of gradually reducing the set write current is called "quenching."

However, for example, if a reference current, which is used to generate the set write current and is received from the outside or generated inside the chip, changes by some factors or if a clock having a wrong value is generated by mismatched circuits, the set write current may be generated to have an undesired quenching slope.

Moreover, without accurately checking the quenching slope, it is impossible to precisely control the phase change resistance cell in program and verify (PNV) operations and a multi-level cell MLC where multi-leveled resistance distribution of a phase change material, e.g., germanium antimony tellurium (GST), is formed.

BRIEF SUMMARY OF THE INVENTION

Embodiments of the present invention are directed to providing a technology for measuring a quenching slope and a step duration at the outside of a chip in case a set write current is supplied to a phase change resistance cell in a write operation so as to control the write current more precisely.

According to an embodiment of the present invention, a nonvolatile semiconductor device comprises: a current generating unit configured to generate a set write current depending on a step pulse that is generated based on a reference current and output the set write current to a memory cell; and a current measuring unit configured to measure a step duration of the step pulse and output the step duration outside of a chip during an activation period of a test enable signal.

The current measuring unit comprises a test control unit configured to measure the step duration to detect a change in a quenching slope of the set write current as a pulse.

The test control unit is configured to measure the step duration and output a first step enable pulse representing a first step pulse duration of the step pulse and a full step enable pulse representing a pulse duration of a whole step of the step pulse.

The current measuring unit further comprises an output unit configured to output the first step enable pulse and the full step enable pulse outside of the chip.

The output unit comprises: a first output pad configured to output the first step enable pulse in response to the test enable signal; and a second output pad configured to output the full step enable pulse in response to the test enable signal.

The test control unit comprises: a plurality of quenching time measuring units configured to measure the step duration of the step pulse; and a pulse generating unit configured to generate the first step enable pulse and the full step enable pulse based on output signals of the plurality of the quenching time measuring units and output the first step enable pulse and the full step enable pulse during the activation period of the test enable signal.

Each of the plurality of quenching time measuring units comprises: a pulse driving unit configured to drive the step pulse in response to an enable signal; and a latch unit configured to latch an output signal of the pulse driving unit.

The current measuring unit further comprises a delay unit configured to delay an initial enable signal to control an enable period of the current measuring unit.

The current generating unit comprises: an oscillator configured to generate a clock for determining a quenching duration of the set write current based on the reference current; a clock counter configured to count the clock and output a count signal; a step pulse generating unit configured to generate the step pulse in response to the count signal; and a write current generating unit configured to generate the set write current depending on the step pulse.

The set write current maintains a given current value for a given time at an initial state and then changes to a current value that is decreased in a step form in response to the step pulse.

A first step period of the set write current has a given duration.

The current measuring unit measures the step duration using a first step pulse corresponding to a period from an initial state until a current value of the set write current starts to decrease in a step form, a second step pulse corresponding to a period ending when the set write current decrease by one step, and a third step pulse corresponding to a period from the initial state until the current value of the set write current decrease by a whole step.

According to another embodiment of the present invention, a method for testing a nonvolatile semiconductor device comprises: generating a set write current depending on a step pulse that is generated based on a reference current and outputting the set write current to a memory cell; and measuring a step duration of the step pulse and outputting the step duration outside of a chip during an activation period of a test enable signal.

The method further comprises measuring a quenching slope change of the set write current at the outside of the chip based on the step duration.

Detecting a high level or a low level of the step duration by applying a time duration to the step duration outputted through an output pad and checking a toggling point to measure the quenching slope change.

The method further comprises converting the quenching slope change of the set write current into a pulse.

The method further comprises outputting a first step enable pulse representing a first step pulse duration of the step pulse and a full step enable pulse representing a pulse duration of whole steps of the step pulse.

The method further comprises: generating a clock for determining a quenching duration of the set write current based on the reference current; counting the clock to output a count signal; generating the step pulse in response to the count signal; and generating the set write current depending on the step pulse.

The set write current maintains a given current value for a given time at an initial state and then changes to a current value that is decreased in a step form in response to the step pulse.

A first step period of the set write current has a given duration.

DESCRIPTION OF EMBODIMENTS

Exemplary embodiments of the present invention will be described in detail with reference to the attached drawings.

Figure 1A:
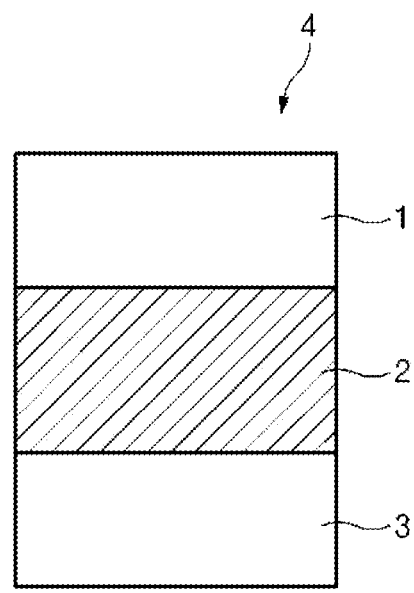
FIGS. 1a and 1b illustrate a conventional phase change resistance device.
Figure 1B:
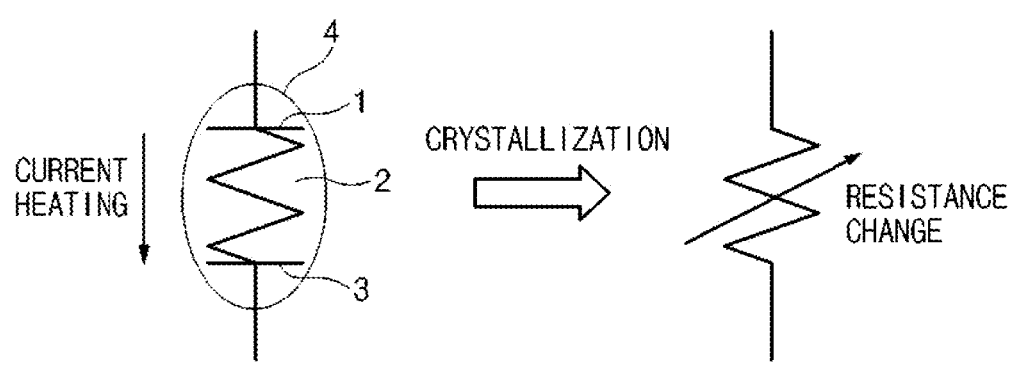
Figure 2A:
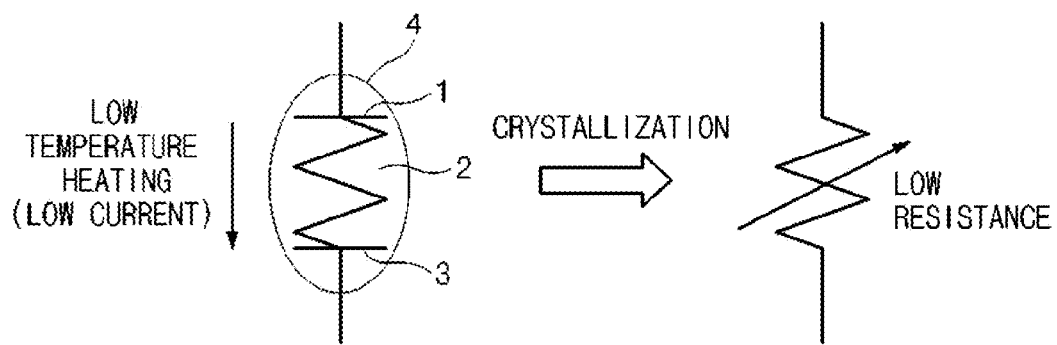
FIGS. 2a and 2b illustrate a phase change principle of the conventional phase change resistance device.
Figure 2B:
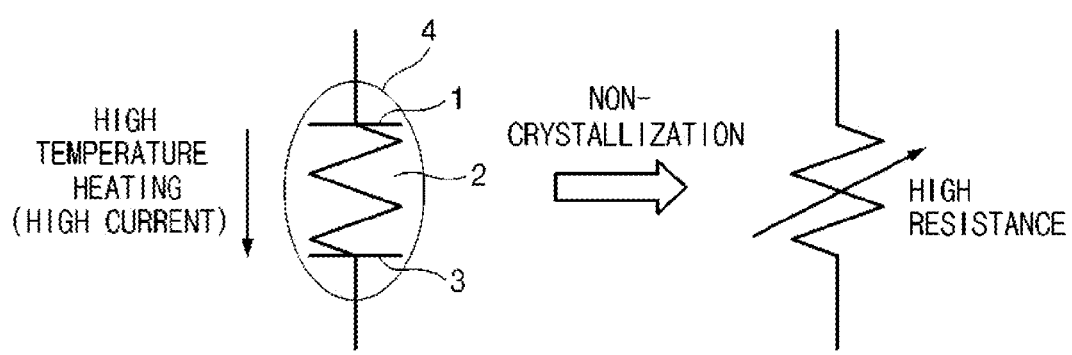
Figure 3:
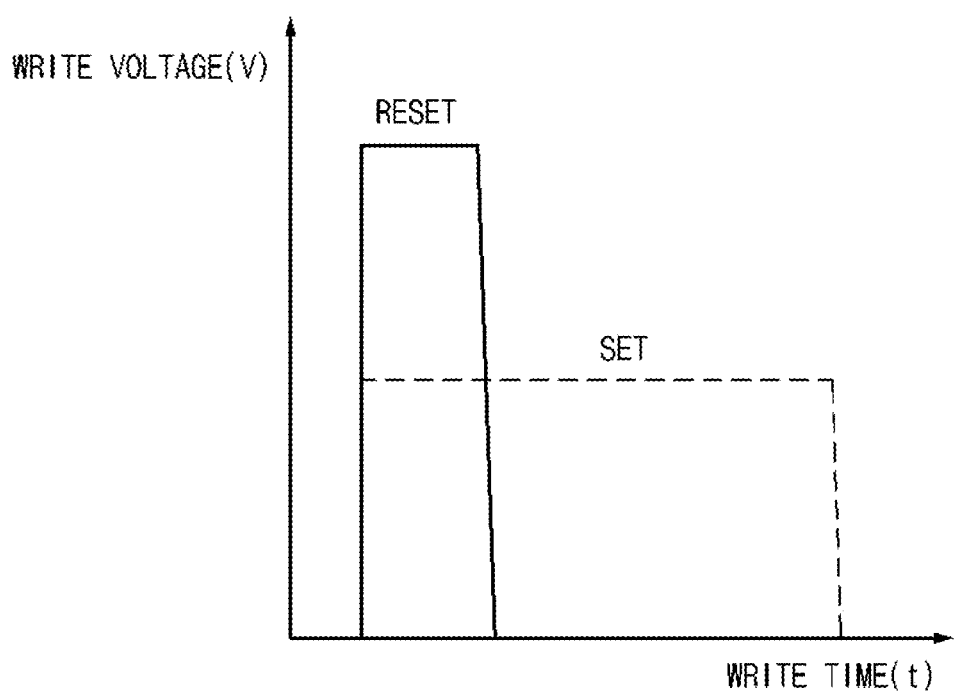
FIG. 3 illustrates a write operation of a conventional phase change resistance cell.
Figure 4:
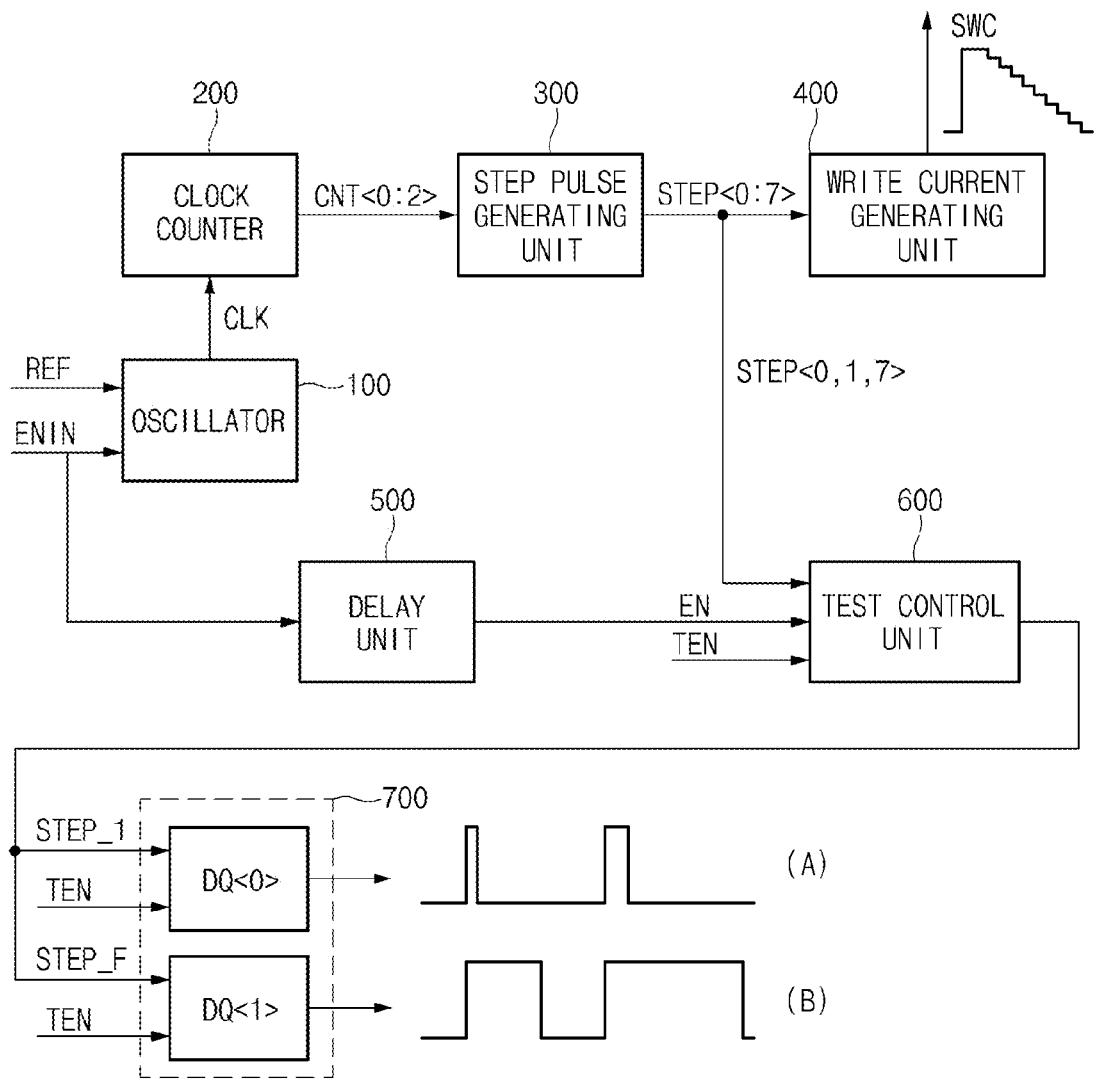
FIG. 4 illustrates a nonvolatile semiconductor device according to an embodiment of the present invention.

FIG. 4 illustrates a nonvolatile semiconductor device according to an embodiment of the present invention.

The nonvolatile semiconductor device includes a current generating unit and a current measuring unit.

The current generating unit includes an oscillator 100, a clock counter 200, a step pulse generating unit 300, and a write current generating unit 400. The current measuring unit includes a delay unit 500, a test control unit 600, and an output unit 700.

The oscillator 100 oscillates a reference current REF during an activation period of an initial enable signal ENIN so as to generate a clock CLK having a quenching duration.

The oscillator 100 generates the clock CLK having a given cycle in order to control a set write current SWC required for crystalizing a phase change resistance cell.

The clock counter 200 counts the clock CLK received from the oscillator 100 and encodes a count result to output count signals CNT<0:2>.

The step pulse generating unit 300 decodes the count signals CNT<0:2> and outputs step pulses STEP<0:7> to the write current generating unit 400. The step pulses STEP<0, 1,7> of the step pulses STEP<0:7> are provided to the test control unit 600.

The write current generating unit 400 controls driving transistors therein in response to the step pulses STEP<0:7> so as to supply the set write current SWC having a desired slope to the phase change resistance cell.

The set write current SWC has a current value that decreases in a step form depending on the step pulses STEP<0:7>. A slope of the set write current SWC is determined by the reference current REF inputted to the oscillator 100.

The delay unit 500 delays the initial enable signal ENIN to output an enable signal EN to the test control unit 600.

The test control unit 600 outputs a first step enable pulse STEP_1 and a full step enable pulse STEP_F in response to the step pulses STEP<0,1,7>, the enable signal EN, and a test enable signal TEN.

That is, the test control unit 600 measures and drives the duration of the step pulses STEP<0,1,7> when the test enable signal TEN is activated.

The test control unit 600 converts a quenching slope change of the set write current SWT into a pulse and outputs the first step enable pulse STEP_1 and the full step enable pulse STEP_F.

The output unit 700 includes output pads DQ<0:1>. The output unit 700 outputs the first step enable pulse STEP_1 and the full step enable pulse STEP_F, which correspond to (A) and (B) of FIG. 4, respectively, during an activation period of the test enable signal TEN.

The first step enable pulse STEP_1 and the full step enable pulse STEP_F may be asynchronously transmitted to the output pads DQ<0:1>.

The first step enable pulse STEP_1 is outputted through the output pad DQ0. The first step enable pulse STEP_1 as a pulse having a short quenching time, as shown in (A) of FIG. 4, represents a pulse width of one step of the step pulse.

The full step enable pulse STEP_F is outputted through the output pad DQ1. The full step enable pulse STEP_F as a pulse having a long quenching time, as shown in (B) of FIG. 4, represents a total pulse width of steps of the step pulse.

That is, a result checked outside of a chip represents a time duration of a pulse where the set write current SWC is quenched.

In an embodiment of the present invention, a quenching slope of the set write current SWC is checked in a test operation. If a test code is inputted, the step enable pulses STEP_1 and STEP_F outputted through the output pads DQ<0:1> may be checked outside of the chip.

Figure 5:
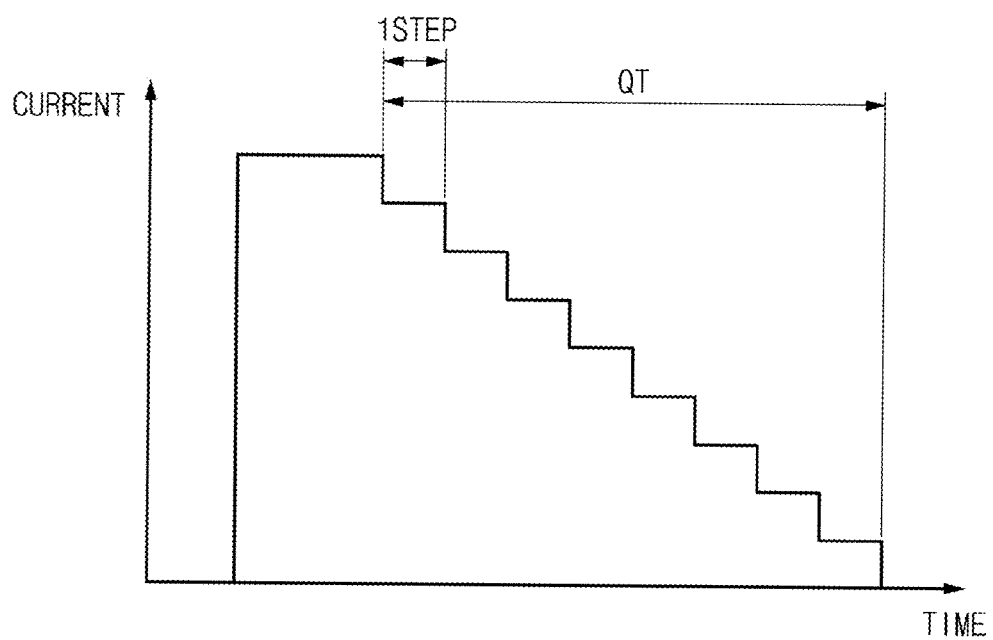
FIG. 5 illustrates a waveform diagram of a set write current according to an embodiment of the present invention.

FIG. 5 illustrates a waveform diagram of the set write current according to an embodiment of the present invention.

The set write current SWC outputted from the write current generating unit 400 has a current value that decreases in a step form as shown in FIG. 5. A given current is supplied in an initial phase for a given time, and then driving transistors in the write current generating unit 400 are sequentially turned off to control the current in the step form.

Since the set write current SWC is generated using the clock CLK from the oscillator 100, the duration of each step of the set write current SWC is constant.

The resistance distribution of the phase change resistance cell is differentiated depending on a slope of quenching slew generated by the set write current SWC that has a current value decreasing in the step form.

In the waveform diagram of FIG. 5, the duration of one step where the set write current SWC is quenched is defined as "1STEP", and the whole quenching time is defined as "QT".

Figure 6:
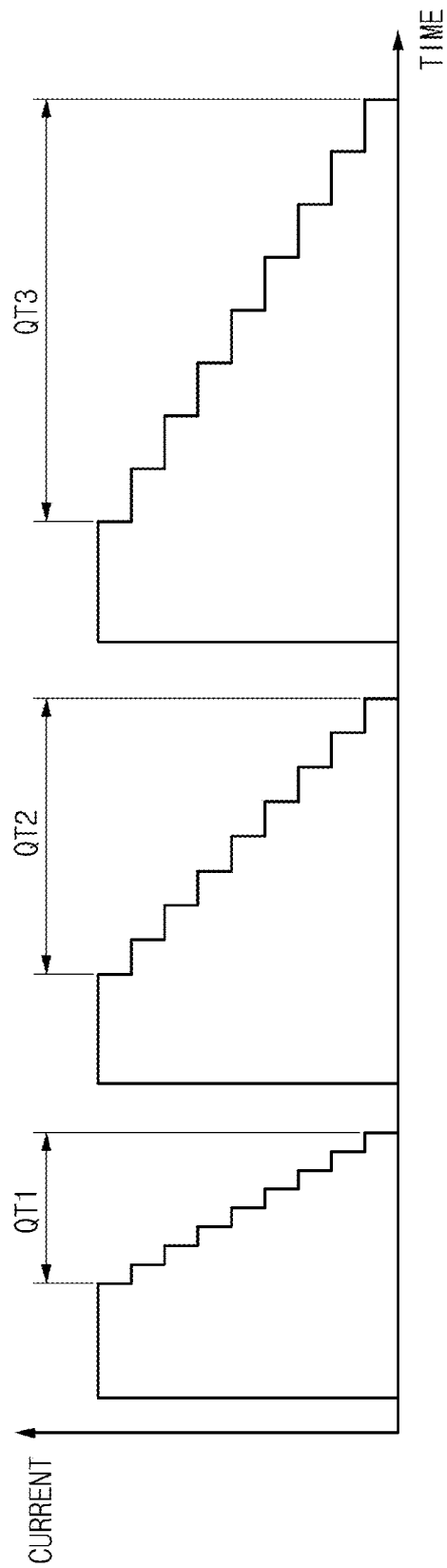
FIG. 6 illustrates a waveform diagram of the set write current having a controlled quenching time according to an embodiment of the present invention.

FIG. 6 illustrates a waveform diagram of a set write current having a controlled quenching time according to an embodiment of the present invention.

Referring to FIG. 6, the quenching time of the set write current SWC may be controlled to, e.g., QT1, QT2, or QT3. As the quenching time becomes longer as shown by QT1, QT2, and QT3, "1STEP", which is the duration of one step where the set write current SWC is quenched and which is shown in FIG. 5, also becomes longer.

The quenching duration of the set write current SWC may be differentiated by the reference current REF inputted to the oscillator 100.

In the prior art, the reference current REF inputted to the oscillator 100 is controlled to regulate the quenching time for crystalizing the phase change resistance cell. However, it is impossible to check whether a desired quenching slope is generated or not in an actual wafer.

On the other hand, in accordance with an embodiment of the present invention, it is possible to measure and control a write current that changes a phase of a phase change material in a write operation.

The state of the phase change material, such as a chalcogenide compound (e.g., Ge—Sb—Te (GST)), is changed by heat generated by a current supplied to the phase change material.

If a phase change resistance cell using the GST is changed into a set phase, a set write current is gradually reduced so that the GST is crystallized.

In order to change the phase change resistance cell into the set phase, it is important to control the quenching slope of the set write current by gradually reducing an amount of the set write current.

In accordance with an embodiment of the present invention, the quenching slope and the step duration can be measured outside of the chip to check and readjust the relationship between the set write current and the phase change of the GST. As a result, the resistance distribution of GST cells may be accurately adjusted.

Figure 7:
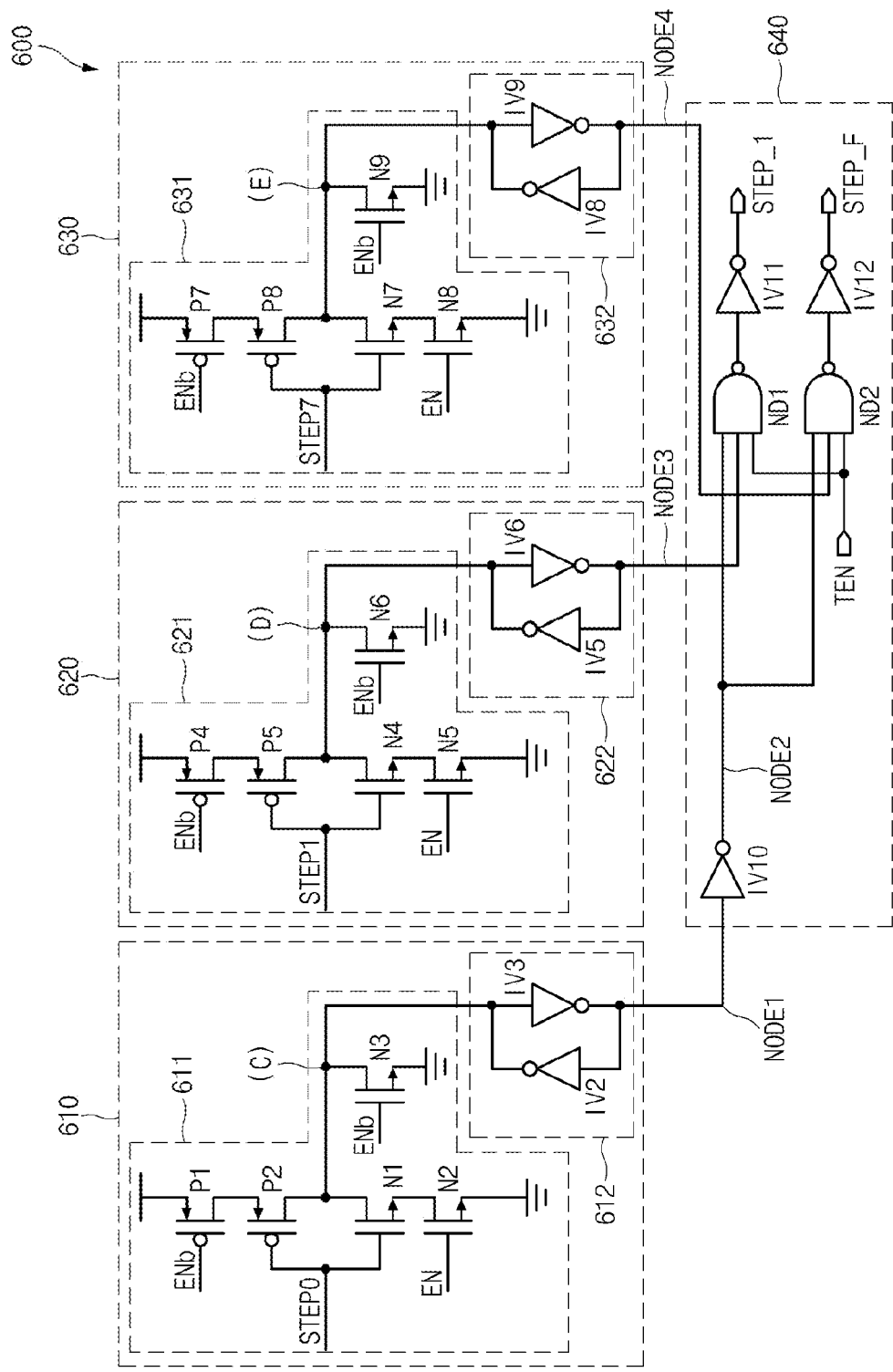
FIG. 7 illustrates a circuit diagram of a test control unit in FIG. 4.

FIG. 7 illustrates a circuit diagram of the test control unit 600 in FIG. 4.

The test control unit 600 includes a plurality of quenching time measuring units 610~630 and a pulse generating unit 640.

The quenching time measuring unit 610 includes a pulse driving unit 611 and a latch unit 612. The pulse driving unit 611 includes a plurality of PMOS transistors P1 and P2 and a plurality of NMOS transistors N1~N3.

The PMOS transistors P1 and P2 and the NMOS transistors N1 and N2 are coupled in series between a power voltage terminal and a ground voltage terminal. The PMOS transistor P1 has a gate to receive an enable signal EN. The enable signal ENb is an inversion signal of the enable signal EN. The PMOS transistor P2 and the NMOS transistor N1 receive the step pulse STEP0 through their gates, which are coupled to each other.

The NMOS transistor N2 has a gate to receive the enable signal ENb.

The NMOS transistor N3 coupled between a node (C) and the ground voltage terminal has a gate to receive the enable signal ENb. The node (C) is coupled to drains of the PMOS transistor P2 and the NMOS transistor N1.

The latch unit 612 includes inverters IV2 and IV3 coupled to each other with a latch type between the node (C) and a node NODE1.

The quenching time measuring unit 620 includes a pulse driving unit 621 and a latch unit 622. The pulse driving unit 621 includes a plurality of PMOS transistors P4 and P5 and a plurality of NMOS transistors N4~N6.

The PMOS transistors P4 and P5 and the NMOS transistors N4 and N6 are coupled in series between the power voltage terminal and the ground voltage terminal. The PMOS transistor P4 has a gate to receive the enable signal EN. The PMOS transistor P5 and the NMOS transistor N4 receive the step pulse STEP1 through their gates, which are coupled to each other.

The NMOS transistor N5 has a gate to receive the enable signal ENb. The NMOS transistor N6 coupled between a node (D) and the ground voltage terminal has a gate to receive the enable signal ENb. The node (D) is coupled to drains of the PMOS transistor P5 and the NMOS transistor N4.

The latch unit 622 includes IV5 and IV6 coupled to each other in a latch form between the node (D) and a node NODE3.

The quenching time measuring unit 630 includes a pulse driving unit 631 and a latch unit 632. The pulse driving unit 631 includes a plurality of PMOS transistors P7 and P8 and a plurality of NMOS transistors N7~N9.

The PMOS transistors P7 and P8 and the NMOS transistors N7 and N8 are coupled in series between the power voltage terminal and the ground voltage terminal. The PMOS transistor P7 has a gate to receive the enable signal EN. The PMOS transistor P8 and the NMOS transistor N7 receive the step pulse STEP7 through their gates, which are coupled to each other.

The NMOS transistor N8 has a gate to receive the enable signal ENb. The NMOS transistor N9 coupled between a node (E) and the ground voltage terminal has a gate to receive the enable signal ENb. The node (E) is coupled to drains of the PMOS transistor P8 and the NMOS transistor N7.

The latch unit 632 includes IV8 and IV9 coupled to each other with a latch type between the node (E) and a node NODE4.

The pulse generating unit 640 includes a plurality of inverters IV10~IV12 and NAND gates ND1 and ND2. The inverter IV10 inverts an output signal of the latch unit 612 to provide an output signal through a node NODE2.

The NAND gate ND1 performs a NAND operation on the output signal of the node NODE2, an output signal of the node NODE3, and the test enable signal TEN. The inverter IV11 inverts an output signal of the NAND gate ND1 to output the first step enable pulse STEP_1.

The NAND gate ND2 performs a NAND operation on the output signal of the node NODE2, an output signal of the node NODE4, and the test enable signal TEN. The inverter IV12 inverts an output signal of the NAND gate ND2 to output the full step enable pulse STEP_F.

Figure 8:
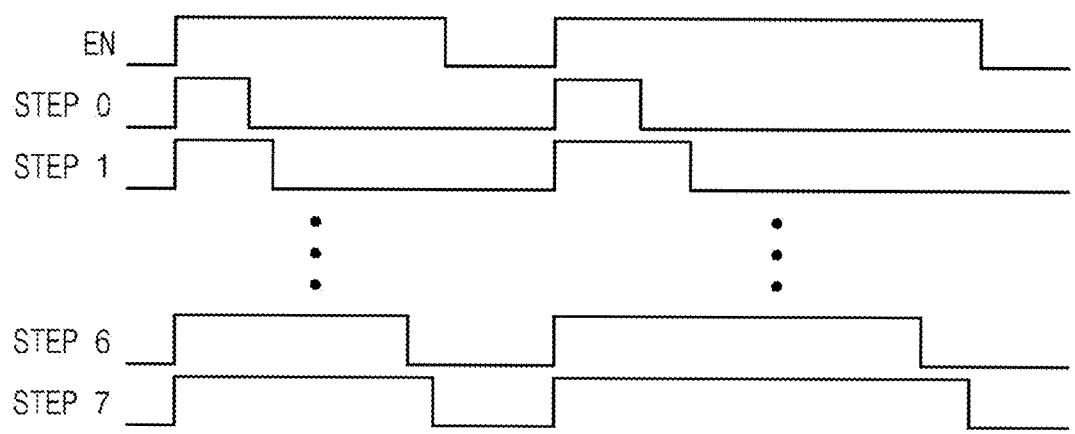
FIG. 8 illustrates a waveform diagram of input pulses of the test control unit in FIG. 4.

The step pulses STEP<0:7> applied to the write current generating unit 400 are shown in FIG. 8.

Referring to FIG. 8, if the enable signal EN has a high level, the step pulses STEP<0:7> are synchronized with the enable signal EN and activated to a high level.

Each subsequent activation period from STEP0 to STEP7 is gradually enlarged so that they are sequentially inactivated to a low level in order from STEP0 to STEP7.

If the enable signal EN has a low level, the final step pulse STEP7 is synchronized with the enable signal EN and inactivated to the low level.

The write current generating unit 400 controls the set write current SWC using the step pulses STEP<0:7> that have different activation periods as shown in FIG. 8.

The test control unit 600 measures the quenching duration of the set write current SWC based on the step pulses STEP<0,1,7> selected from the step pulses STEP<0:7> and outputs measured results outside of the chip.

In an embodiment of the present invention, the three step pulses STEP<0,1,7> of the step pulses STEP<0:7> are used to measure the duration of one step and the duration of total steps included in the set write current.

The quenching time is measured using the step pulse STEP0 representing a period where the set write current SWC does not decrease, the step pulse STEP1 representing a period where the set write current SWC decreases by one step, and the step pulse STEP7 representing a period where the set write current SWC decreases from an initial step to a final step, i.e., by the whole steps.

Figure 9:
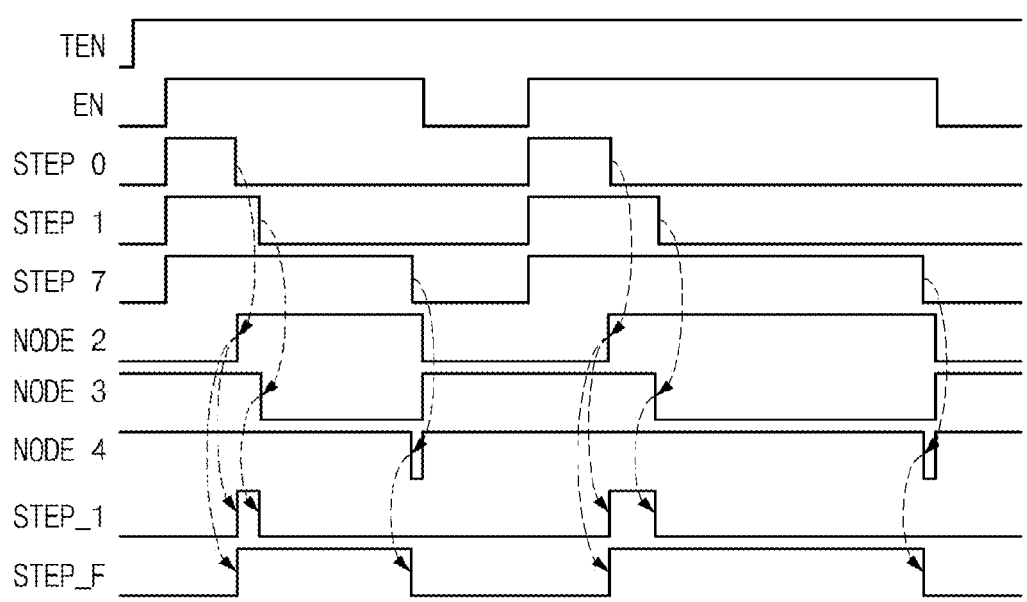
FIG. 9 illustrates a timing diagram of the test control unit in FIG. 7.

FIG. 9 illustrates a timing diagram of signals relating to the test control unit 600 in FIG. 7.

In an initial phase, if the enable signal EN has a low level, i.e., the enable signal ENb has a high level, the NMOS transistors N3, N6, and N9 in FIG. 7 are turned on. As a result, the nodes (C), (D), and (E) have a low level, and thus the nodes NODE2, NODE3, and NODE4 have a low level, a high level, and a high level, respectively.

After that, if the enable signal EN is enabled to a high level, the test control unit 600 starts to measure the quenching time of the step pulses STEP<0,1,7>.

If the enable signal EN and the step pulse STEP0 move to a high level, the PMOS transistor P1 and the NMOS transistor N2 are turned on, and the PMOS transistor P2 is turned off while the NMOS transistor N1 is turned on. At this time, the NMOS transistor N3 is turned off. As a result, the node (C) maintains a low level, and the node NODE2 also maintains a low level.

Subsequently, if the step pulse STEP0 moves to a low level, the PMOS transistor P2 is turned on while the NMOS transistor N1 is turned off, so that the node (C) moves to a high level, and the node NODE2 also moves to a high level. The node NODE2 maintains a high level for a latch time of the latch unit 612.

If the enable signal EN moves to a low level again, i.e., the enable signal ENb moves to a high level, the NMOS transistor N3 is turned on. Thus, the node (C) moves to a low level again, and the node NODE2 also moves to a low level.

In the same way, if the enable signal EN and the step pulse STEP1 move to a high level, the PMOS transistor P4 and the NMOS transistor N5 are turned on, and the PMOS transistor P5 is turned off while the NMOS transistor N4 is turned on. At this time, the NMOS transistor N6 is turned off. Thus, the node (D) has a low level, and the node NODE3 has a high level.

Subsequently, if the step pulse STEP1 moves to a low level, the PMOS transistor P5 is turned on while the NMOS transistor N4 is turned off, so that the node (D) moves to a high level, and the node NODE3 moves to a low level. The node NODE3 maintains a low level for a latch time of the latch unit 622.

If the enable signal EN moves to a low level, i.e., the enable signal ENb moves to a high level, the NMOS transistor N6 is turned on, so that the node (D) moves to a low level, and the node NODE3 moves to a high level.

Likewise, if the enable signal EN and the step pulse STEP7 move to a high level, the PMOS transistor P7 and the NMOS transistor N8 are turned on, and the PMOS transistor P8 is turned off while the NMOS transistor N7 is turned on. At this time, the NMOS transistor N9 is turned off. Thus, the node (E) has a low level, and the node NODE4 has a high level.

Subsequently, if the step pulse STEP7 moves to a low level, the PMOS transistor P8 is turned on while the NMOS transistor N7 is turned off, so that the node (E) moves to a high level, and the node NODE4 moves to a low level.

If the enable signal EN moves to a low level, the NMOS transistor N9 is turned on. Then, the node (E) moves to a low level, and the node NODE4 moves to a high level.

The pulse generating unit 640 performs an AND operation on the output signal of the node NODE2, the output signal of the node NODE3, and the test enable signal TEN. The pulse generating unit 640 also performs an AND operation on the output signal of the node NODE2, the output signal of the node NODE4, and the test enable signal TEN.

As a result, in a period where all of the above output signals on the nodes NODE2 and NODE3 and the test enable signal TEN are enabled to a high level, the first step enable pulse STEP_1 having a high level is outputted. In a period where all of the output signals on the nodes NODE2 and NODE4 and the test enable signal TEN are enabled to a high level, the full step enable pulse STEP_F having a high level is outputted.

Figure 10:
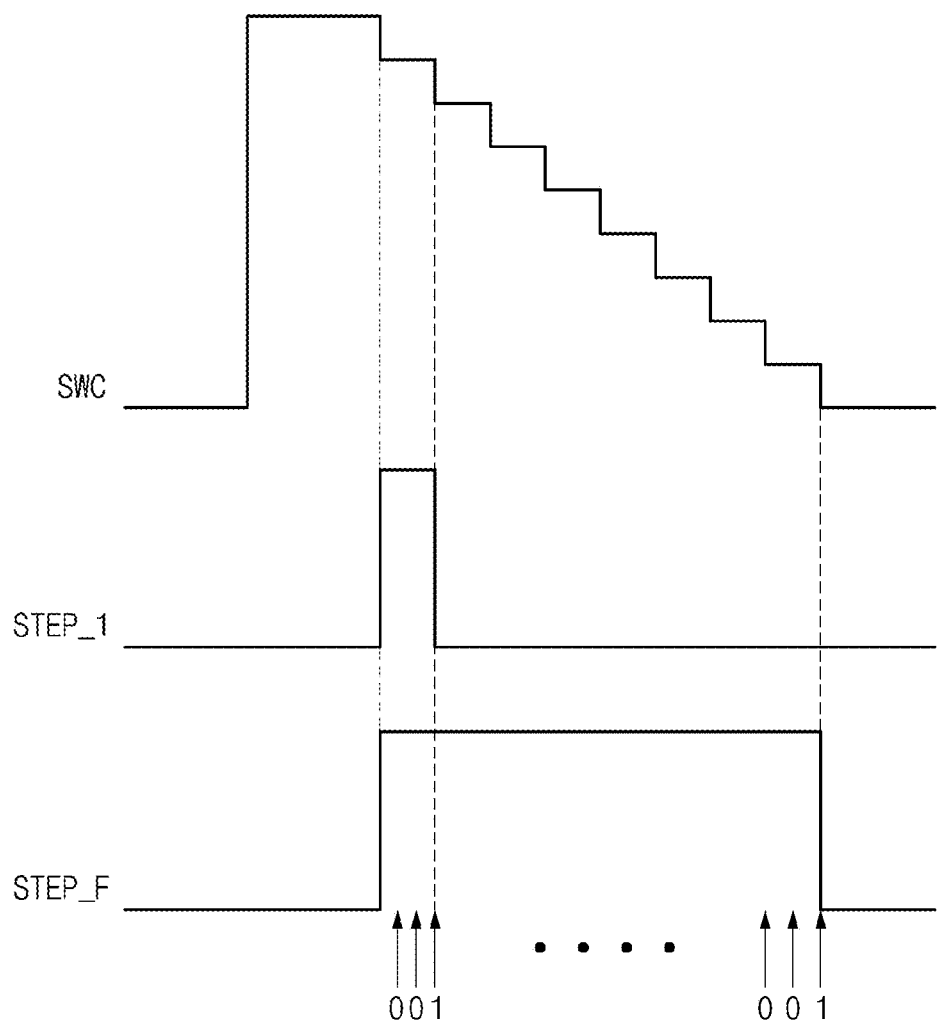
FIG. 10 illustrates input/output pad signals in a nonvolatile semiconductor device according to an embodiment of the present invention.

FIG. 10 illustrates input/output pad signals in a nonvolatile semiconductor device according to an embodiment of the present invention. FIG. 10 shows a method of numerically measuring the quenching duration of the set write current.

Pulse periods of the first step enable pulse STEP_1 and the full step enable pulse STEP_F, outputted outside the chip through the output pads DQ0 and DQ1 of the output unit 700, are measured so that the quenching duration of the set write current may be measured.

The quenching duration of the set write current is numerically measured at the wafer level by detecting a high or low level of the measured pulse by applying a time duration to the measured pulse and checking a toggling point.

For example, since the first step enable pulse STEP_1 is at a high level for a discrete short period, a high level period is represented as data "0" and a low level transition period is represented as data "1".

In the same way, since the full step enable pulse STEP_F is also at a high level for a discrete short period, a high level period is represented as data "0" and a low level transition period is represented as data "1".

By using this method, the quenching duration of the set write current can be checked numerically without using an oscilloscope. Moreover, it is possible to check the variation of the quenching duration of the set write current depending on a specific condition by changing a die in a wafer.

Outside of the chip, the number of data "0" or "1" from the pulses outputted through the output pads DQ0 and DQ1 is determined, so that the quenching slope and the step duration of the set write current may be measured.

In accordance with an embodiment of the present invention, it is possible to measure the change of the quenching slope and the step duration of the write current depending on variation of the reference current in the test operation and to check this at the package level so as to accurately control resistance distribution of the cells.

In addition, it is possible to verify the quenching slope and the step duration of the write current of several dies under different conditions As described above, in accordance with the present invention, the quenching slope and the step duration can be verified outside of a chip so as to check which change affects a desired quenching slope. As a result, it is possible to form a phase change material having a desired resistance distribution.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A nonvolatile semiconductor device, comprising:
   a current generating unit configured to generate a set write current depending on a step pulse that is generated based on a reference current and output the set write current to a memory cell; and
   a current measuring unit configured to measure a step duration of the step pulse and output the step duration outside of a chip during an activation period of a test enable signal,
   wherein the current measuring unit comprises a test control unit configured to measure the step duration to detect a change in a quenching slope of the set write current as a pulse.

2. The nonvolatile semiconductor device according to Claim 1, wherein the test control unit is configured to measure the step duration and output a first step enable pulse representing a first step pulse duration of the step pulse and a full step enable pulse representing a pulse duration of a whole step of the step pulse.

3. The nonvolatile semiconductor device according to claim 2, wherein the current measuring unit further comprises an output unit configured to output the first step enable pulse and the full step enable pulse outside of the chip.

4. The nonvolatile semiconductor device according to claim 3, wherein the output unit comprises:
   a first output pad configured to output the first step enable pulse in response to the test enable signal; and
   a second output pad configured to output the full step enable pulse in response to the test enable signal.

5. The nonvolatile semiconductor device according to claim 2, wherein the test control unit comprises:
   a plurality of quenching time measuring units configured to measure the step duration of the step pulse; and
   a pulse generating unit configured to generate the first step enable pulse and the full step enable pulse based on output signals of the plurality of the quenching time measuring units and output the first step enable pulse and the full step enable pulse during the activation period of the test enable signal.

6. The nonvolatile semiconductor device according to claim 5, wherein each of the plurality of quenching time measuring units comprises:
   a pulse driving unit configured to drive the step pulse in response to an enable signal; and
   a latch unit configured to latch an output signal of the pulse driving unit.

7. The nonvolatile semiconductor device according to claim 1, wherein the current measuring unit further comprises a delay unit configured to delay an initial enable signal to control an enable period of the current measuring unit.

8. The nonvolatile semiconductor device according to claim 1, wherein the current generating unit comprises:
   an oscillator configured to generate a clock for determining a quenching duration of the set write current based on the reference current;
   a clock counter configured to count the clock and output a count signal;
   a step pulse generating unit configured to generate the step pulse in response to the count signal; and a write current generating unit configured to generate the set write current depending on the step pulse.

9. The nonvolatile semiconductor device according to claim 1, wherein the set write current maintains a given current value for a given time at an initial state and then changes to a current value that is decreased in a step form in response to the step pulse.

10. The nonvolatile semiconductor device according to claim 9, wherein a first step period of the set write current has a given duration.

11. The nonvolatile semiconductor device according to claim 1, wherein the current measuring unit measures the step duration using a first step pulse corresponding to a period from an initial state until a current value of the set write current starts to decrease in a step form, a second step pulse corresponding to a period ending when the set write current decreases by one step, and a third step pulse corresponding to a period from the initial state until the current value of the set write current decreases by a whole step.

12. A method for testing a nonvolatile semiconductor device, the method comprising:
 generating a set write current depending on a step pulse that is generated based on a reference current and outputting the set write current to a memory cell;
 measuring a step duration of the step pulse and outputting the step duration outside of a chip during an activation period of a test enable signal: and
 measuring a quenching slope change of the set write current at the outside of the chip based on the step duration.

13. The method according to claim 12, further comprising:
 detecting a high level or a low level of the step duration by applying a time duration to the step duration outputted through an output pad; and
 checking a toggling point to measure the quenching slope change.

14. The method according to claim 12, wherein the measuring of the step duration comprises converting the quenching slope change of the set write current into a pulse.

15. The method according to claim 14, wherein the measuring of the step duration further comprises outputting a first step enable pulse representing a first step pulse duration of the step pulse and a full step enable pulse representing a pulse duration of whole steps of the step pulse.

16. The method according to claim 12, wherein the generating of the set write current comprises:
 generating a clock for determining a quenching duration of the set write current based on the reference current;
 counting the clock to output a count signal;
 generating the step pulse in response to the count signal; and
 generating the set write current depending on the step pulse.

17. The method according to claim 12, wherein the set write current maintains a given current value for a given time at an initial state and then changes to a current value that is decreased in a step form in response to the step pulse.

18. The method according to claim 17, wherein a first step period of the set write current has a given duration.

* * * * *